(12) United States Patent
Efferenn et al.

(10) Patent No.: US 7,157,381 B2
(45) Date of Patent: Jan. 2, 2007

(54) METHOD FOR PROVIDING WHISKER-FREE ALUMINUM METAL LINES OR ALUMINUM ALLOY LINES IN INTEGRATED CIRCUITS

(75) Inventors: Dirk Efferenn, Dresden (DE); Jens Hahn, Dresden (DE); Uwe Kahler, Dresden (DE); Chung-Hsin Lin, Dresden (DE); Jens Bachmann, Dresden (DE); Wen-Bin Lin, Dresden (DE); Grit Bonsdorf, Dresden (DE)

(73) Assignees: Infineon Technologies AG, Munich (DE); Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/868,309

(22) Filed: Jun. 15, 2004

(65) Prior Publication Data

US 2005/0277300 A1 Dec. 15, 2005

(51) Int. Cl.
*H01L 21/302* (2006.01)
(52) U.S. Cl. ............... 438/734; 438/714; 438/720; 438/750; 134/1.2; 134/1.3
(58) Field of Classification Search ............ 134/1.2, 134/1.3; 216/77, 102; 438/714, 720, 734, 438/750, 754
See application file for complete search history.

(56) References Cited

U.S. PATENT DOCUMENTS 4,899,206 A * 2/1990 Sakurai et al. .......... 257/734
5,866,444 A * 2/1999 Yamazaki et al. ....... 438/161
6,433,842 B1 * 8/2002 Kaneko et al. ............ 349/43
6,501,094 B1 * 12/2002 Yamazaki et al. .......... 257/57

FOREIGN PATENT DOCUMENTS

| JP | 57-183053 | * | 11/1982 |
| JP | 61-127149 | * | 6/1986 |
| JP | 02-143425 | * | 6/1990 |

OTHER PUBLICATIONS

L. Succo et al.: "Influence of target microstructure on the propensity for whisker growth in sputter-deposited aluminum alloy fims", *J. Vac. Sci. Technol.*, vol. A7, No. 3, May/Jun. 1989, pp. 814-816.

* cited by examiner

*Primary Examiner*—George A. Goudreau
(74) *Attorney, Agent, or Firm*—Laurence A. Greenberg; Werner H. Stemer; Ralph E. Locher

(57) ABSTRACT

A method for providing whisker-free aluminum metal lines or aluminum alloy lines in integrated circuits includes the following steps: providing a substrate; providing a whisker-containing layer made of aluminum metal or an aluminum alloy on the substrate; back-etching and/or resputtering the whisker-containing layer such that the whiskers are essentially removed; and structuring the whisker-free layer into the lines.

7 Claims, 5 Drawing Sheets

METHOD FOR PROVIDING WHISKER-FREE ALUMINUM METAL LINES OR ALUMINUM ALLOY LINES IN INTEGRATED CIRCUITS

BACKGROUND OF THE INVENTION

Field of the Invention

The present invention lies in the integrated technology field. More specifically, the invention relates to a method for providing whisker-free aluminum metal lines or aluminum alloy lines in integrated circuits.

L. Succo et al., J. Vac. Sci. Technol. A7 (3) May/June 1989, pages 814 et seq., disclose the influence of target microstructure on the propensity for whisker-growth in sputter-deposited aluminum alloy films. The particular mechanism by which the microstructure of the sputtering target influences the propensity for whisker growth in the deposited film is proposed to be the emission of silicon—silicon and aluminum-copper dimers by the target.

In the manufacture of integrated circuits, for contact fill applications having an aspect ratio of less then 1, it is necessary to use aluminum deposition processes having temperatures of more then 350° C.

Generally, aluminum whiskers which form when aluminum is sputtered at elevated temperatures of more then 350° C. can cause serious problems to the following structuring steps, for example, lithography or etch, especially if used with a hardmask integration scheme. The consequence is yield loss due to metal shorts.

Currently there is no solution to the problem. Whisker growth per se can be reduced by tuning the deposition conditions, such as, for instance, better chamber pressure during deposition, but there is no method known to prevent whisker growth entirely.

FIGS. 4A–4C depict an example of a method for providing aluminum metal lines or aluminum alloy lines having whiskers in integrated circuits for illustrating the problems underlying the present invention.

A first metal layer M1 is formed of Al—Cu alloy. An interlevel dielectric layer ID is provided on the layer M1. The layer ID is formed with vias V.

Further with reference to FIG. 4B, an aluminum alloy layer M2 made of Al—Cu is provided on the interlevel dielectric layer ID. The layer M2 exhibits a whisker W.

In the next step, a photoresist layer R is provided on that layer M2 and an opening O is structured therein. The whisker W is present in the opening O, and consequently the photoresist cannot be removed under the whisker W.

As a consequence, in the following etching step which is illustrated in FIG. 4C, the Al—Cu layer M2 cannot be completely removed in the opening O. The result is a short circuit SC.

FIGS. 5A–5C depict an example of a method for providing whisker-free aluminum metal lines or aluminum alloy lines in integrated circuits for illustrating the problems underlying the present invention.

An integrated circuit substrate 1 has a sputtered aluminum metal layer M formed thereon. The layer M exhibits a whisker W.

In this example, a liner layer L made of Ti/TiN is deposited on the aluminum layer M before the whisker W is removed by a brush step using a brush BRS. The brush BRS is illustrated in FIG. 5B.

Finally, as shown in FIG. 5C, an $O_3$ plasma treatment is performed in order to oxidize the remainder of the whisker W in the liner layer L.

The disadvantage of this exemplary method resides in the fact that the liner layer will be affected by deep scratches. In these scratches a later-deposited photoresist will remain even after exposure. This leads to problems in the following lithography and etching steps.

SUMMARY OF THE INVENTION

It is accordingly an object of the invention to provide a method of providing whisker-free aluminum metal lines or aluminum alloy lines in integrated circuits which overcomes the above-mentioned disadvantages of the heretofore-known devices and methods of this general type and which is improved relative to the prior art.

With the foregoing and other objects in view there is provided, in accordance with the invention, a method for providing whisker-free aluminum metal lines or aluminum alloy lines in integrated circuits. The novel method comprises the following steps:

providing a substrate;

forming a whisker-containing layer of aluminum metal or an aluminum alloy on the substrate;

removing the whiskers by back-etching and/or resputtering the whisker-containing layer to form a substantially whisker-free layer; and structuring the whisker-free layer to form the lines.

The idea underlying the present invention is to apply a process to remove the whiskers after metal deposition by an additional resputter or etchback process step which could be integrated into the metal deposition itself or realized as a separate process. The process can be placed post metal deposition or post top liner deposition, if used. As the whiskers are very thin metal wires having a thickness of only some nanometers, they can be removed by a short isotropic or anisotropic metal back-etch or back sputter sequence using noble gas ions. This process can be carried out in the aluminum metal or aluminum alloy deposition chamber itself applying a RF Bias at the wafer or in a separate chamber.

The novel method has the advantage that standard equipment can be used which is already present in a microelectronic factory. In the case of a placement before the top liner deposition, an $O_3$ plasma treatment of the exposed metal layer does not need to be used, and it is even thinkable that the process step is integrated into the last metal deposition. In the case of an ex situ process plasma treatment can be effected in the etch chamber.

Preferred embodiments are recited in the dependent claims.

In accordance with an added feature of the invention, the back-etching step is a DSP step using HF and $H_2SO_4$ as main etchants.

In accordance with an additional feature of the invention, the resputtering step is performed using noble gas ions, preferably Ar ions.

In accordance with another feature of the invention, before the back-etching and/or resputtering step a liner layer is provided on the whisker-containing layer and after the back-etching and/or resputtering step an oxidation step is performed for oxidizing an exposed part of the whisker-free layer.

In accordance with a further feature of the invention, the oxidation step is an $O_3$ plasma step.

In accordance with again an added feature of the invention, the step of providing a whisker-containing layer made of aluminum metal or an aluminum alloy on the substrate is a sputtering step and the back-etching and/or resputtering step is performed in situ with this sputtering step.

In accordance with again a further feature of the invention, the whisker-containing layer is made of AlCu.

In accordance with a concomitant feature of the invention, the liner layer is made of Ti and/or TiN.

Other features which are considered as characteristic for the invention are set forth in the appended claims.

Although the invention is illustrated and described herein as embodied in a a method for providing whisker-free aluminum metal lines or aluminum alloy lines in integrated circuits, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
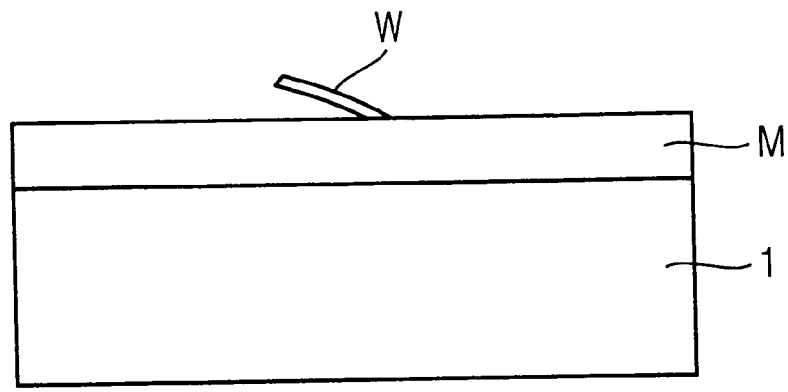
FIGS. 1A–1C are diagrammatic side views illustrating a first embodiment of the method for providing whisker-free aluminum metal lines or aluminum alloy lines in integrated circuits according to the present invention.
Figure 1B:
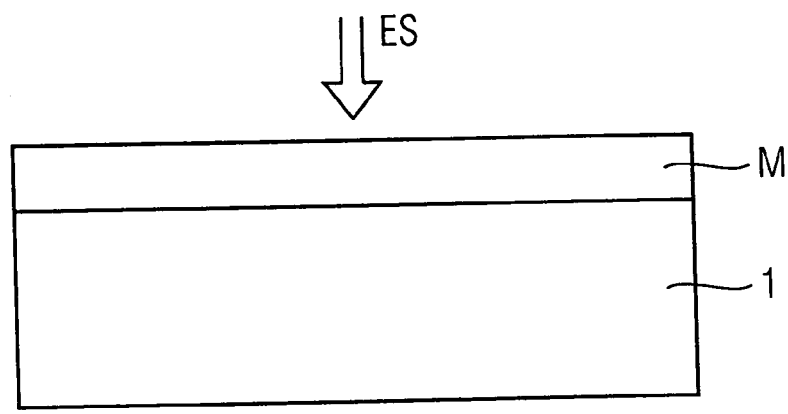
Figure 1C:
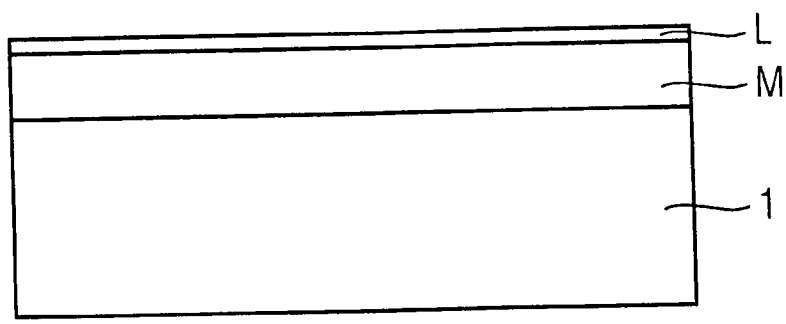

Referring now to the figures of the drawing in detail and first, particularly, to FIGS. 1A–1C thereof, there is shown a first embodiment of the method for providing whisker-free aluminum metal lines or aluminum alloy lines in integrated circuits according to the present invention.

As shown in FIG. 1A, an aluminum metal layer M is provided on an integrated circuit substrate 1. The metal layer M has an whisker W.

In this example, an etch back step ES is performed using a DSP etchant. The main etch chemicals of the DSP etchant are HF and $H_2SO_4$. After having removed the whisker W, as shown in FIG. 1B, a liner layer L made of Ti/TiN is deposited on the resulting structure. Here, the liner layer L serves as an inorganic anti-reflection coating for later lithography steps.

Figure 2A:
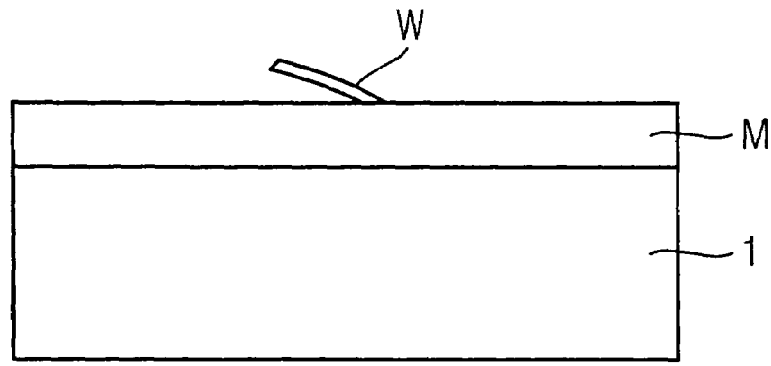
FIGS. 2A–2C are similar view of a second embodiment of the method for providing whisker-free aluminum metal lines or aluminum alloy lines in integrated circuits according to the present invention.
Figure 2B:
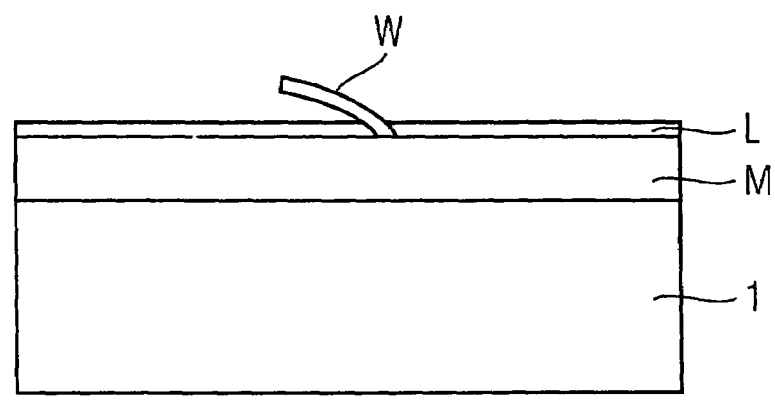
Figure 2C:
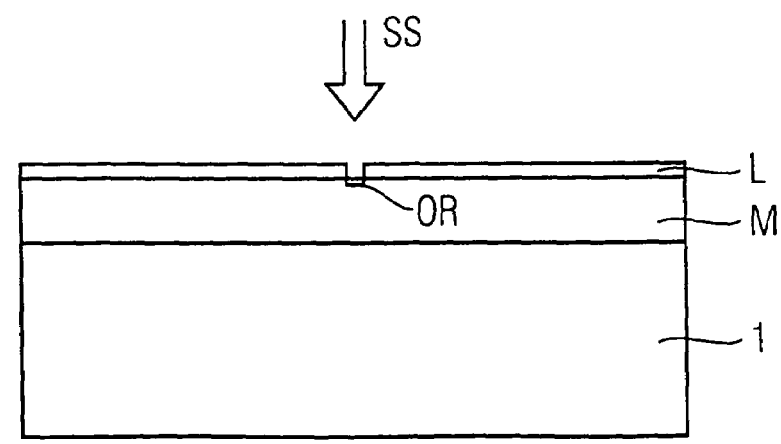

FIGS. 2A–2C depict a second embodiment of the method for providing whisker-free aluminum metal lines or aluminum alloy lines in integrated circuits according to the present invention.

The structure shown in FIG. 2A is substantially identical to the structure shown in FIG. 1A shown above. In contrast with the first embodiment, a liner layer L of Ti/TiN is deposited here on the aluminum metal layer L before the whisker W is removed. This is illustrated in FIG. 2B.

Further, a resputtering step SS is applied using argon, for example, in order to remove the whisker. Finally, an $O_3$ plasma treatment is performed to oxidize an exposed region OR of the aluminum metal layer M. This results in the structure shown in FIG. 2C.

FIGS. 3A–3D depict a third embodiment of the method for providing whisker-free aluminum metal lines or aluminum alloy lines in integrated circuits according to the present invention.

Figure 3A:
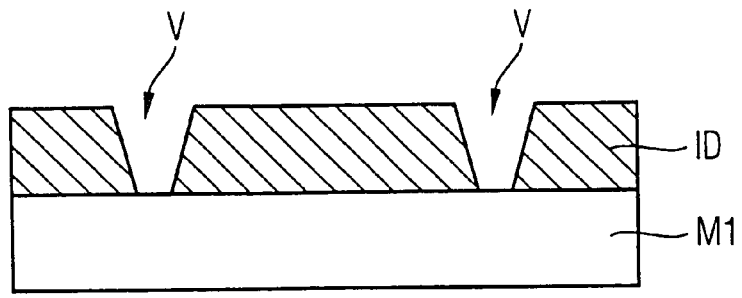
FIGS. 3A–3D are diagrammatic side views illustrating a third embodiment of the method for providing whisker-free aluminum metal lines or aluminum alloy lines in integrated circuits according to the present invention.

In FIG. 3A a first metallization layer M1 of AlCu is provided on a non-illustrated integrated circuit substrate 1. An interlevel dielectric layer ID having vias V is provided on the metalizaton layer M1.

Figure 3B:
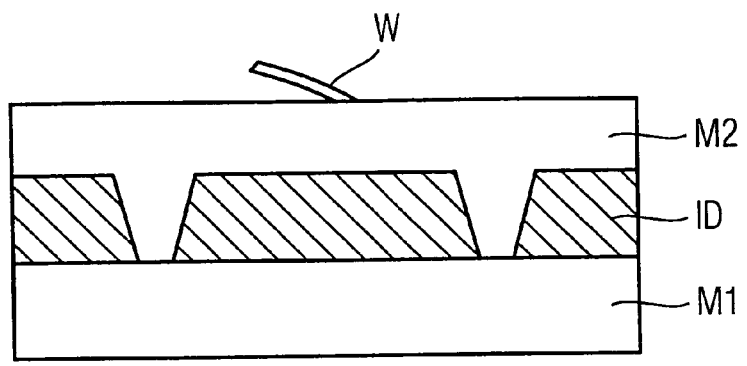

Next, as shown in FIG. 3B, an AlCu layer M2 is sputtered onto the resulting structure. The layer M2 has a whisker W.

Figure 3C:
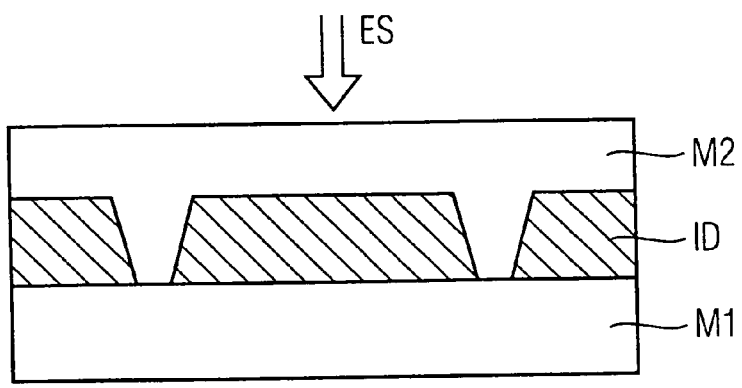

In the next process step, illustrated in FIG. 3C, an etchback step ES is performed in order to remove the whisker W. The etchback step ES uses DSP etchant as described above.

Figure 3D:
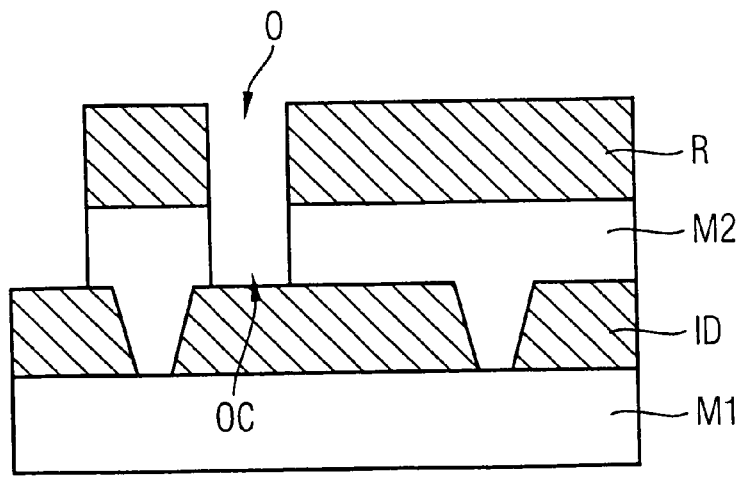
Figure 4A:
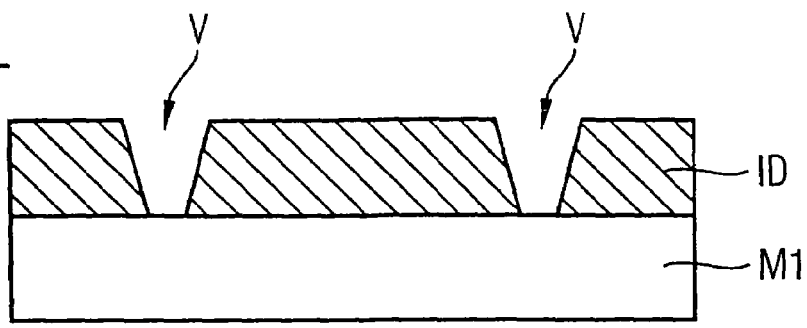
FIGS. 4A–4C are similar views showing a prior art example of a method for providing aluminum metal lines or aluminum alloy lines having whiskers in integrated circuits for illustrating the problems underlying the present invention.
Figure 4B:
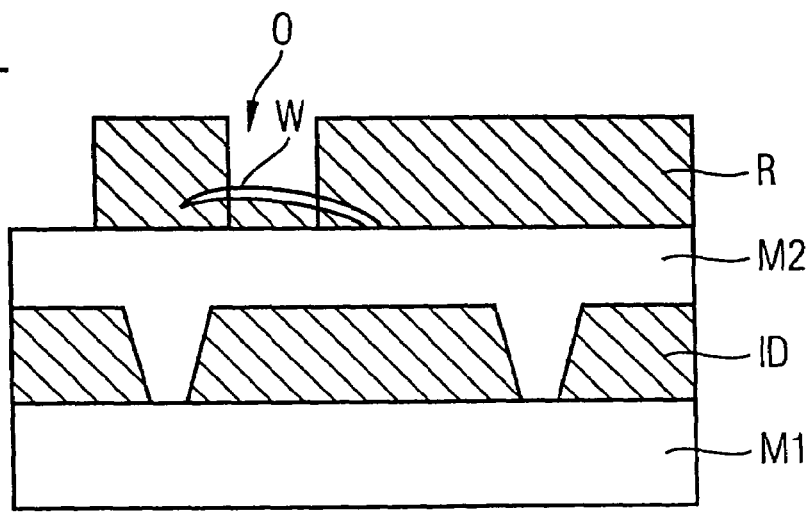
Figure 4C:
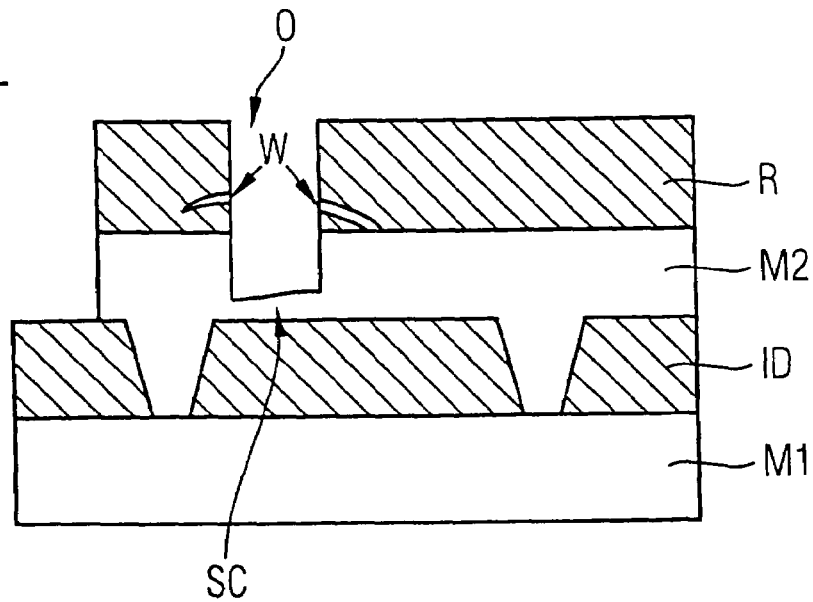
Figure 5A:
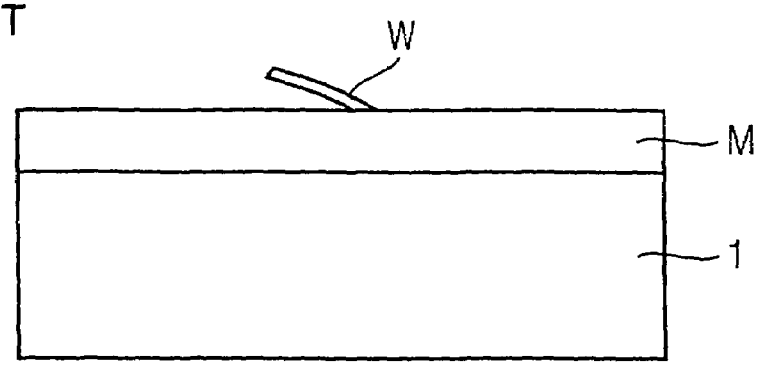
FIGS. 5A–5C show an example of a method for providing whisker-free aluminum metal lines or aluminum alloy lines in integrated circuits for illustrating the problems underlying the present invention.
Figure 5B:
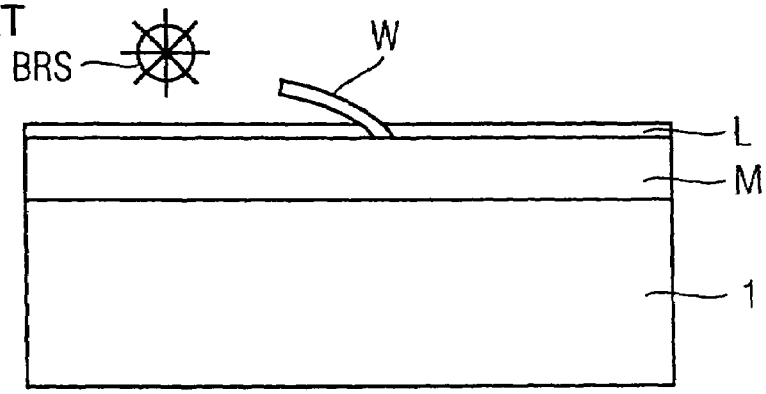
Figure 5C:
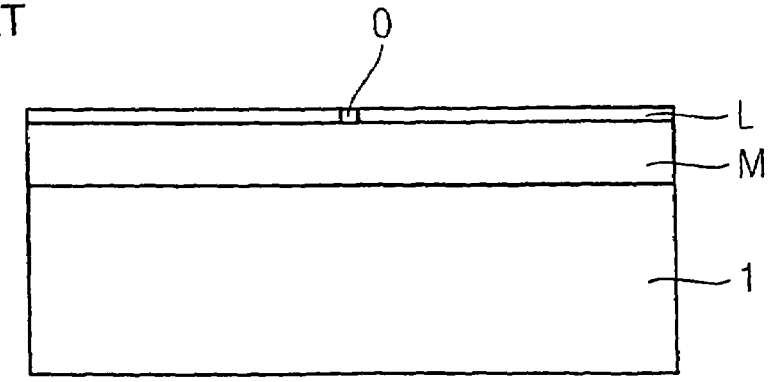

Finally, as shown in FIG. 3D, a photoresist layer R having an opening O is provided on the resulting structure, and the metal layer M2 is etched using that resist layer R with the opening O as a mask. This etching step leads to an open circuit structure OC in the resulting structure. In other words, the short circuit shown in FIG. 4C can be reliably prevented by performing the etchback step ES which completely removes the whisker W.

Although the present invention has been described with regard to specific embodiments, it is not limited thereto, but may be modified in many ways.

Although in the foregoing an aluminum metal layer and an AlCu aluminum alloy layer have been cited as examples, other aluminum alloy layers are conceivable which exhibit whiskers that can be treated in accordance with the present invention.

Also, the present invention is not restricted to the DSP etch step and the argon ion resputtering, as described above, but other isotropic or anisotropic etches can be used or other ions, preferably noble gas ions, can be used for resputtering.

We claim:

1. A method for providing whisker-free aluminum metal lines or aluminum alloy lines in integrated circuits, which comprises:
    providing a substrate;
    forming a whisker-containing layer of aluminum metal or an aluminum alloy on the substrate;
    substantially removing the whiskers by etching back the whisker-containing layer to form a substantially whisker-free layer; and
    structuring the whisker-free layer to form the lines.

2. The method according to claim 1, which comprises etching back in a DSP (Dilute Sulphuric acid hydrogen Peroxide) step using H202 and $H_2SO_4$ as primary etchants.

3. The method according to claim 1, which comprises, prior to the removing step, forming a liner layer on the whisker-containing layer and, following the removing step, performing an oxidation step for oxidizing an exposed part of the whisker-free layer.

4. The method according to claim 3, wherein the oxidation step is an $O_3$ plasma step.

5. The method according to claim 1, wherein the step of forming the whisker-containing layer of aluminum metal or aluminum alloy is a sputtering step, and the removing step is performed in situ with the sputtering step.

6. The method according to claim 1, wherein the whisker-containing layer is formed of AlCu.

7. The method according to claim 3, wherein the liner layer is a layer formed of at least one material selected from the group consisting of Ti and TiN.

* * * * *